United States Patent
Nakata et al.

(10) Patent No.: US 11,377,591 B2
(45) Date of Patent: Jul. 5, 2022

(54) LIQUID COMPOSITION, PHOTOELECTRIC CONVERSION ELEMENT PRODUCTION METHOD, AND PHOTOELECTRIC CONVERSION ELEMENT

(71) Applicant: SHARP KABUSHIKI KAISHA, Sakai (JP)

(72) Inventors: Kanako Nakata, Sakai (JP); Tatsuya Ryohwa, Sakai (JP); Hiroshi Fukunaga, Sakai (JP); Makoto Izumi, Sakai (JP); Youhei Nakanishi, Sakai (JP); Hisayuki Utsumi, Sakai (JP); Masayuki Kanehiro, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 132 days.

(21) Appl. No.: 16/981,471

(22) PCT Filed: Mar. 26, 2018

(86) PCT No.: PCT/JP2018/012077
§ 371 (c)(1),
(2) Date: Sep. 16, 2020

(87) PCT Pub. No.: WO2019/186633
PCT Pub. Date: Oct. 3, 2019

(65) Prior Publication Data
US 2021/0024823 A1    Jan. 28, 2021

(51) Int. Cl.
*C09K 11/06* (2006.01)
*H01L 51/00* (2006.01)
*H01L 51/50* (2006.01)
*H01L 51/42* (2006.01)

(52) U.S. Cl.
CPC .......... *C09K 11/06* (2013.01); *H01L 51/0003* (2013.01); *H01L 51/005* (2013.01); *H01L 51/5004* (2013.01); *H01L 51/0042* (2013.01); *H01L 51/426* (2013.01); *H01L 51/502* (2013.01)

(58) Field of Classification Search
CPC ... C09K 11/06; H01L 51/0003; H01L 51/005; H01L 51/426
See application file for complete search history.

(56) References Cited

U.S. PATENT DOCUMENTS

2015/0267106 A1    9/2015    Pillay Narrainen et al.

FOREIGN PATENT DOCUMENTS

| JP | 2003-254810 A | 9/2003 |
|----|---------------|--------|
| JP | 2012-169460 A | 9/2012 |
| JP | 2016-197219 A | 11/2016 |
| JP | 2017-514299 A | 6/2017 |
| WO | 2015/190335 A1 | 12/2015 |

*Primary Examiner* — Anthony Ho
(74) *Attorney, Agent, or Firm* — ScienBiziP, P.C.

(57) ABSTRACT

A QD particle dispersion contains a surface modification compound that protects a surface of QD phosphor particles dispersed in a solvent. The surface modification compound includes a heteroatom-containing functional group and a chain-type saturated hydrocarbon group. The QD particle dispersion is configured such that the absolute value of a difference between the surface free energy of an underlayer that provides a foundation for forming a QD layer in the light-emitting element and the surface free energy of the QD layer is 5 mN/m or less.

14 Claims, 7 Drawing Sheets

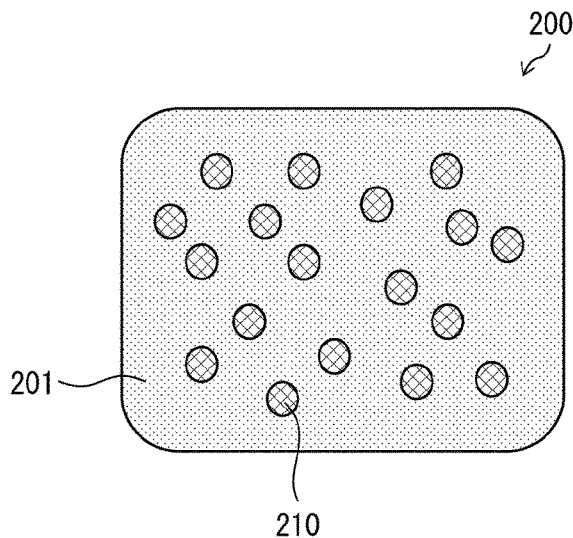

FIG. 4

| | HYDROCARBON CHAIN LENGTH | SURFACE FREE ENERGY [mN/m] | DIFFERENCE FROM UNDERLAYER [mN/m] |
|---|---|---|---|
| OCTYLAMINE | 8 | 48.27 | 2.27 |
| HEXADECYLAMINE | 16 | 43.93 | 2.07 |
| OCTADECYLAMINE | 18 | 51.33 | 5.33 |
| OLEYLAMINE | 18 | 51.31 | 5.31 |
| PVK (UNDERLAYER) | – | 46 | – |

FIG. 5

GOOD: GOOD DISPERSIBILITY (NO TURBIDITY), POOR: POOR DISPERSIBILITY (TURBID), -: NOT DETERMINED

| MODIFIER | HYDROCARBON CHAIN LENGTH | | | | |
|---|---|---|---|---|---|
| | 4 | 8 | 12 | 16 | 18 |
| AMINE | BUTYLAMINE POOR | OCTYLAMINE GOOD | DODECYLAMINE - | HEXADECYLAMINE GOOD | OCTADECYLAMINE GOOD OLEYLAMINE GOOD |
| THIOL | BUTANETHIOL POOR | OCTANETHIOL GOOD | DODECANETHIOL GOOD | HEXADECANETHIOL GOOD | OCTADECANETHIOL - |

FIG. 6

LIQUID COMPOSITION, PHOTOELECTRIC CONVERSION ELEMENT PRODUCTION METHOD, AND PHOTOELECTRIC CONVERSION ELEMENT

TECHNICAL FIELD

One aspect of the disclosure relates to a liquid composition containing quantum dot particles.

BACKGROUND ART

In recent years, elements utilizing characteristics of quantum dots (QD) have been developed, such as light-emitting elements that include QD phosphor particles.

PTL1 describes technology for suppressing degradation while maintaining the quantum yield of QD phosphor particles when QD phosphor particles are used in a light-emitting layer of a light-emitting element. Specifically, at least part of surface ligands (ligand) of the QD phosphor are a surface-modifying ligand containing silicon. In light-emitting elements such as light-emitting diodes, silicone polymers with low oxygen permeability may be used as encapsulating materials. The QD phosphors have a high affinity with silicone polymers, thereby making it difficult for the QD phosphors to aggregate in the encapsulating material.

CITATION LIST

Patent Literature

PTL1: JP 2017-514299 T (published on Jun. 1, 2017)

SUMMARY

Technical Problem

However, with the technology described above, the structure of the applicable elements is limited. In the manufacturing of a variety of elements, desirably, a thin, uniform film (QD layer) containing QD particles can be formed (film formation) as easily as possible.

A purpose of one aspect of the disclosure is to improve the performance of the QD layer by improving the film formability of the QD layer.

Solution to Problem

To solve the above-mentioned problem, a liquid composition of one aspect of the disclosure is applied onto an underlayer to form a quantum dot layer containing quantum dot particles, the liquid composition including: a solvent; quantum dot particles dispersed in the solvent; and a surface protection material protecting a surface of the quantum dot particles, wherein the underlayer supplies electrons or positive holes to the quantum dot layer; the surface protection material contains, as a main component, a surface modification compound including: a functional group having a heteroatom, and a chain-type saturated hydrocarbon group represented by the molecular formula $C_nH_{2n+1}$ (n being a natural number); and an absolute value of a difference between a surface free energy of the quantum dot layer and a surface free energy of the underlayer is 5 mN/m or less.

To solve the abovementioned problem, a photoelectric conversion element of one aspect of the disclosure is provided with a quantum dot layer between a first electrode and a second electrode disposed above the first electrode, the photoelectric conversion element including: an underlayer and the quantum dot layer formed on the underlayer, wherein the underlayer supplies electrons or positive holes to the quantum dot layer; the quantum dot layer includes quantum dot particles and a surface protection material protecting a surface of the quantum dot particles; the surface protection material contains, as a main component, a surface modification compound including a functional group having a heteroatom, and a chain-type saturated hydrocarbon group represented by the molecular formula $C_nH_{2n+1}$ (n being a natural number); and an absolute value of a difference between a surface free energy of the quantum dot layer and a surface free energy of the underlayer is 5 mN/m or less.

Advantageous Effects of Disclosure

According to the liquid composition of one aspect of the disclosure, the film formability of the QD layer can be improved. Accordingly, the formation of defects in the QD layer can be suppressed, and the performance of the QD layer can be improved. The same effects are exhibited with a photoelectric conversion element according to one aspect of the disclosure.

BRIEF DESCRIPTION OF DRAWINGS

FIG. 4 is a schematic view illustrating a schematic configuration of a polyvinyl carbazole (PVK) dispersion according to the first embodiment of the disclosure.

FIG. 5 is a table showing the surface free energy of each of the QD films containing various amines used in the experimental examples, and the difference between the surface free energy of each of the QD films containing these amines and the surface free energy of the PVK film.

FIG. 6 is a table showing the dispersibility, in a solvent, of QD phosphor particles that are surface-protected by a surface modifier for cases in which various types of amines and thiols having a different number of carbons in the hydrocarbon chain (different hydrocarbon chain lengths) are used as respective surface modifiers.

DESCRIPTION OF EMBODIMENTS

Embodiments of the disclosure will be described in details below. Note that the following description is provided to facilitate a better understanding of the spirit of the disclosure, and is not intended to limit the disclosure unless otherwise specified. Further, note that each drawing schematically describes the shape, structure, and positional relationship of each member, and is not necessarily drawn to scale.

First Embodiment

The following describes one embodiment of the disclosure with reference to the drawings.

In the present embodiment, a light-emitting element is described as an example of a photoelectric conversion element (which can also be referred to as an optical semiconductor element), and a liquid composition used to manufacture the light-emitting element is also described. Note that the photoelectric conversion element and the liquid composition of one aspect of the disclosure are not limited thereto. The liquid composition in one aspect of the disclosure may also be used to manufacture other types of photoelectric conversion elements.

Herein, the term photoelectric conversion element means both an element that converts electrical energy into light energy and an element that converts light energy into electrical energy. Examples of such photoelectric conversion elements include light-emitting elements, photovoltaic elements, and image sensors of various types.

(Light-Emitting Element)

The configuration of a light-emitting element 1 manufactured using the liquid composition of the present embodiment will be described schematically based on (a) of FIG. 1. (a) of FIG. 1 is a cross-sectional view illustrating a schematic configuration of a light-emitting element 1 according to the present embodiment.

Figure 1:
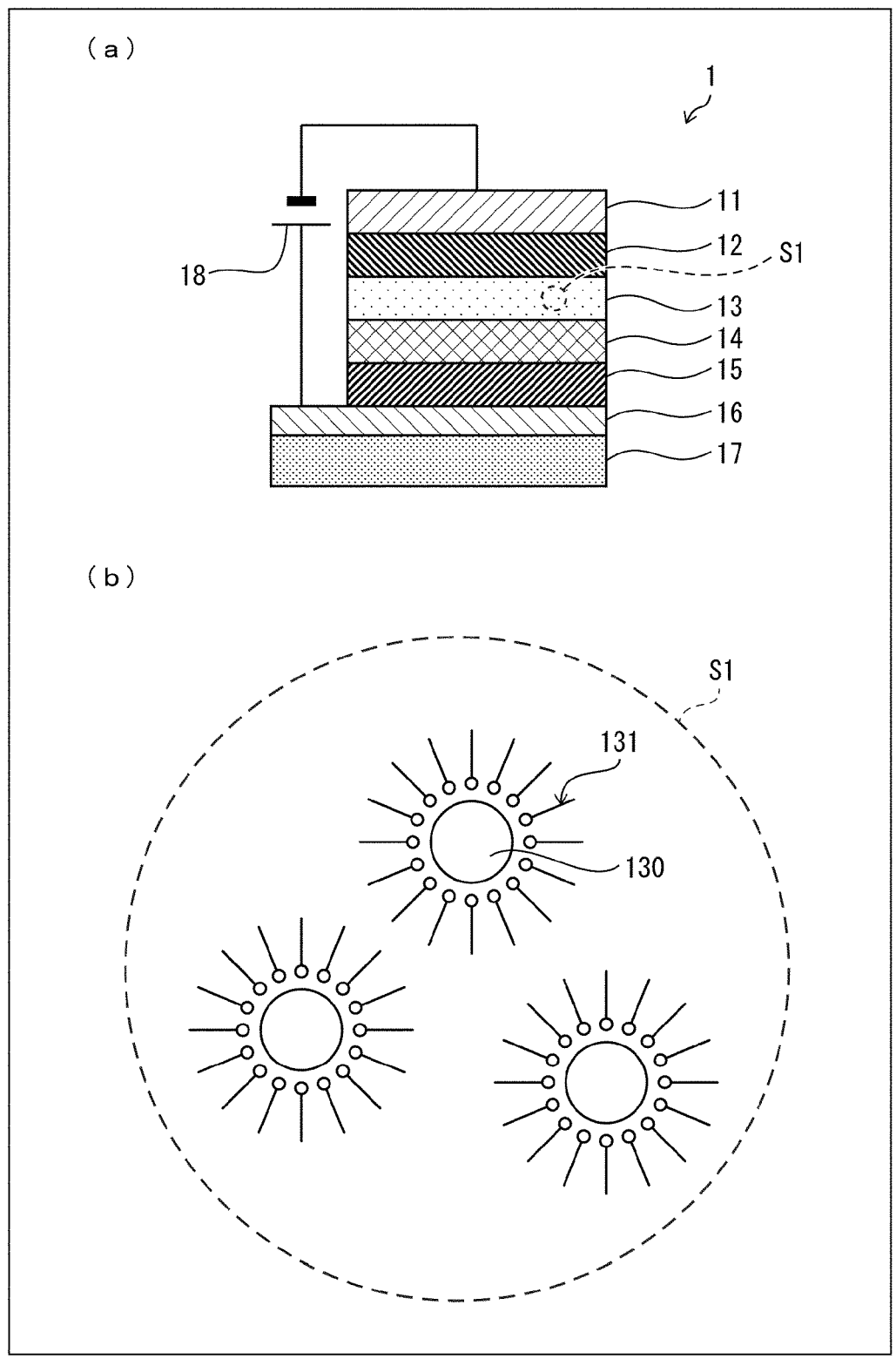
FIG. 1(a) is a cross-sectional view illustrating a schematic configuration of a light-emitting element according to a first embodiment of the disclosure.
FIG. 1(b) is an enlarged view of a portion of a QD layer included in the light-emitting element.

As illustrated in (a) of FIG. 1, in the light-emitting element 1, a quantum dot layer (QD layer) 13 containing QD phosphor particles is provided between a first electrode 11 and a second electrode 16. In the present embodiment, the first electrode 11 is a cathode, and the second electrode 16 is an anode. Hereinafter, a direction from the second electrode 16 to the first electrode 11 is referred to as an upward direction. A direction opposite to the upward direction is referred to as a downward direction.

The light-emitting element 1 may be used, for example, as a light source for an electronic device (e.g., a display device). Of the members included in the light-emitting element 1, the description of members not related to the present embodiment will be omitted as appropriate. It may be understood that members for which descriptions have been omitted are similar to known members.

The QD layer 13 includes QD phosphor particles (quantum dot particles) 130 (see (b) of FIG. 1 described below). As described below, the QD layer 13 is formed using a QD particle dispersion (liquid composition) 100 (see FIG. 2) in which QD phosphor particles 130 are dispersed in a solvent. In the first embodiment, the QD phosphor particles 130 emit light as a result of the combination of positive holes (holes) supplied from the second electrode 16 (anode) and electrons supplied from the first electrode 11 (cathode). The QD layer 13 of the present embodiment functions as a light-emitting layer.

The light-emitting element 1 is provided with: the first electrode 11, an electron transportation layer (ETL) 12, the QD layer 13, a hole transportation layer (HTL) 14, a hole injection layer (HIL) 15, the second electrode 16, and a substrate 17 in this order from the upward direction towards the downward direction. The second electrode 16 is disposed above the first electrode 11. The first electrode 11 and the second electrode 16 can each be connected to a power supply 18 (e.g., a direct current power supply). The substrate 17 supports from the first electrode 11 to the second electrode 16.

The first electrode 11 and/or the second electrode 16 is a transmissive electrode that transmits light emitted from the QD layer 13. The substrate 17 may be constituted of a light-transmissive material or may be constituted of a light-reflective material.

In the present embodiment, the second electrode 16 is constituted from, for example, indium tin oxide (ITO). In other words, the second electrode 16 is configured as a light-transmissive electrode. The first electrode 11 is constituted from aluminum (Al), for example. That is, the first electrode 11 is configured as a reflective electrode that reflects light emitted from the QD layer 13.

According to this configuration, of the light emitted from the QD layer 13, the light oriented in an upward direction can be reflected by the first electrode 11. As a result, the light reflected by the first electrode 11 can be directed to the second electrode 16 (downward direction). In this case, the substrate 17 is constituted of a light-transmissive material. In this way, the light-emitting element 1 can emit, mainly in the downward direction, light output from the QD layer 13. The light-emitting element 1 is configured as a bottom-emitting type light-emitting element.

However, the light-emitting element 1 may also be configured to emit, mainly in an upward direction, light output from the QD layer 13. For example, the second electrode 16 may be configured to function as a reflective electrode, and the first electrode 11 may be configured to function as a light-transmissive electrode. In this way, the light-emitting element 1 may be configured as a top-emitting type light-emitting element. Alternatively, the light-emitting element 1 may be configured to emit, in both the upward direction and the downward direction, light output from the QD layer 13. In other words, the light-emitting element 1 may be configured as a double-sided light-emitting type light-emitting element.

The electron transportation layer 12 contains a material with an excellent electron transport property. The electron transportation layer 12 preferably inhibits the transport of positive holes. The electron transportation layer 12 includes, for example, ZnO nanoparticles (NP). The electron transportation layer 12 may also function as an electron injection layer (EIL) that promotes the injection of electrons into the QD layer 13 from the first electrode 11.

A hole injection layer 15 promotes the injection of positive holes into the QD layer 13 from the second electrode 16. The hole injection layer 15 contains, for example, poly(3, 4-ethylenedioxythiophene):poly(4-styrenesulfonic acid) (PEDOT:PSS). The hole transportation layer 14 includes a material with excellent hole transport properties. The hole transportation layer 14 includes, for example, polyvinyl carbazole (PVK).

By applying a forward voltage between the second electrode 16 (anode) and the first electrode 11 (cathode) (by setting the second electrode 16 to a higher potential than that of the first electrode 11) using the power supply 18, (i) electrons can be supplied from the first electrode 11 to the QD layer 13, and (ii) positive holes can be supplied from the second electrode 16 to the QD layer 13. As a result, in the QD layer 13, light can be generated as a result of the combination of positive holes and electrons. Application of a voltage by the power supply 18 may be controlled by a thin film transistor (TFT) (not illustrated).

(Knowledge of the Invention)

Here, knowledge of the disclosure relating to the QD layer 13 in the light-emitting element 1 as described above is described in brief below.

To prepare the QD layer 13 as described above, a film (QD film) containing QD phosphor particles must be thinly and uniformly formed on the hole transportation layer 14. The hole transportation layer 14 is considered to be a layer (underlayer, second layer) that serves as an underlayer on which the QD layer (third layer) 13 is formed. An example of a method of forming the QD layer 13 so as to be layered on the hole transportation layer 14 is spin coating.

Note that the QD layer 13 may be formed on the electron transportation layer 12. In this case, the electron transportation layer 12 becomes the underlayer (second layer). The hole transportation layer 14 is formed on the hole injection layer (first layer) 15. The hole transportation layer 14 may be formed on the second electrode (first layer) 16 in a case where the hole injection layer 15 is not provided.

Generally, QD phosphor particles are often mixed with an organic binder and used. Attempts have been made in the past to improve the dispersibility of QD phosphor particles in a solution containing an organic binder by using a surface protection material (capping agent) that is highly miscible with an organic binder.

However, when a solution in which QD phosphor particles and a solvent containing an organic binder are mixed is subjected to a coating process such as spin coating, it may not be possible to uniformly form a QD film on the underlayer. In this case, pinholes may be formed in the QD layer 13, and coating unevenness may occur. When such defects are present in the QD layer 13, the light-emitting element 1 experiences unevenness in brightness. Moreover, such defects can also lead to a reduction in the luminous efficiency and service life of the element.

The present inventors conducted diligent research to solve the problems described above. As a result, the following knowledge was obtained.

Namely, when the QD layer is to be formed using a QD particle dispersion, it is necessary to consider both the wettability of the QD particle dispersion with respect to the underlayer and the dispersibility of the QD phosphor particles in the solvent. The wettability of the QD particle dispersion with respect to the underlayer can be improved by reducing the difference between the surface free energy of the underlayer and the surface free energy of the QD particle dispersion.

Here, when the light-emitting element 1 is to be manufactured as described above, the following can be said regarding the QD particle dispersion and the underlayer.

The magnitude of the surface free energy of the QD particle dispersion can be adjusted by changing the type or concentration of material contained in the QD particle dispersion. On the other hand, depending on various requirements (element performance, constraints in the manufacturing line, and the like) in the manufacturing process of an element (for example, a light-emitting element), various limitations arise from perspectives of dispersibility and coatability of the QD particle dispersion. For example, in the QD particle dispersion, the concentrations of QD phosphor particles and the surface protection material are stipulated to a certain extent. Therefore, it has been difficult to adjust the surface free energy of the QD particle dispersion by changing the concentrations of the QD phosphor particles and surface protection material. In addition, the material forming the underlayer is also stipulated to a certain extent depending on the manufacturing process of the element or the like. Therefore, ordinarily, the range in which the surface free energy of the underlayer can be changed is also narrow.

In other words, it has been difficult to reduce the difference between the surface free energy of the QD particle dispersion and the surface free energy of the underlayer through measures such as changing the concentration of QD phosphor particles contained in the QD particle dispersion or the concentration of the surface protection material contained in the QD particle dispersion, or changing the material of the underlayer.

Additionally, the QD particle dispersion is applied to the underlayer, and the solvent is evaporated to thereby form the QD layer. The behavior (change in wettability to the underlayer) of the QD particle dispersion during this film formation process affects film formability.

Therefore, the present inventors conceived of using the value of the surface free energy of the QD layer formed using the QD particle dispersion to search for appropriate conditions for the QD particle dispersion. Through this, the surface free energy of the QD particle dispersion can be inferred (indirectly evaluated).

As a result of further research, the inventors discovered that when a surface modification compound having an alkyl chain is used as the surface protection material included in the QD particle dispersion, the surface free energy of the QD layer, that is, the surface free energy of the QD particle dispersion, can vary depending on the chain length of the alkyl chain of the surface modification compound. Based on this knowledge, the present inventors arrived at the disclosure.

Specifically, a surface modification compound is selected so that the absolute value of the difference between the surface free energy of the QD layer and the surface free energy of the underlayer is 5 mN/m or less. As a result, the wettability of the QD particle dispersion to the underlayer is improved, and the film formability of the QD layer can be improved.

Here, a surface modification compound for QD phosphor particles is generally selected with emphasis primarily on increasing the dispersibility and quantum yield of QD phosphor particles in the QD particle dispersion. That is, in the related art, the surface modification compound of the QD phosphor particles is selected from the perspective of increasing the dispersibility of the QD phosphor particles in the solvent or binder component and preventing aggregation, and the effect on wettability to the underlayer is not considered.

In addition, in the related art, a binder component having a binding action for forming a light-emitting layer may be included in a solution in which QD phosphor particles are dispersed (see, for example, PTL1). In this case, the wettability of the binder to the underlayer is considered. In contrast, rather than wettability between the binder and the underlayer, the disclosure considers, based on the new concept described above, wettability between the underlayer and the QD particle dispersion containing a surface modification compound.

In one aspect of the disclosure, the QD particle dispersion is prepared as follows. That is, the QD particle dispersion includes, as a main component in a surface protection material, a surface modification compound that is selected to improve dispersibility of QD phosphor particles in a solvent and to improve wettability of the QD particle dispersion to the underlayer. Such a surface modification compound can be selected by adjusting the length of the alkyl chain of the surface modification compound having an alkyl chain. As a result, a QD film can be uniformly formed on the underlayer while preventing aggregation of the QD phosphor particles 130 (the film formability of the QD layer 13 can be improved).

In addition, in one aspect of the disclosure, it is not necessary to include a binder in the solution used to form the QD layer 13. For example, a colloidal solution that does not contain a binder and is formed by dispersing QD phosphor particles in a non-polar solvent can be used to uniformly form the QD layer 13.

(QD Layer)

The QD layer 13 of the present embodiment will be described with reference to (b) of FIG. 1. (b) of FIG. 1 is an enlarged diagram schematically illustrating a portion (S1) of a QD layer included in the light-emitting element 1.

As illustrated in (b) of FIG. 1, the surface of each QD phosphor particle 130 in the QD layer 13 is protected by a surface modification compound 131.

The QD phosphor particles 130 are semiconductor nanocrystals in which the crystals are of a nanometer size. The crystal size of the QD phosphor particles 130 may be a size that is generally recognized as a quantum dot, that is, the crystal size may be a size that results in a quantum confinement effect. The range of such a size may vary depending on the type of material forming the QD phosphor particles 130. Additionally, the size of individual QD phosphor particles 130 is not constant, and the QD phosphor particles 130 have a distribution of sizes. Therefore, the crystal size is expressed as an average particle size. The QD phosphor particles 130 need only have an average particle size that is within a range in which the quantum confinement effect occurs.

The material forming the QD phosphor particles 130 is not particularly limited as long as the material generates a quantum confinement effect. In the QD phosphor particles 130, excitons are generated by the combination of positive holes and electrons through the Coulomb force. Light of a predetermined wavelength band is emitted as a result of the recombination of excitons.

The QD layer 13 emits light through electro-luminescence (EL) (more specifically, through injection type EL). The QD layer 13 is basically conducted through a tunneling effect. Specifically, a tunnel current flows in the vertical direction in the QD layer 13. The tunnel current feeds positive holes and electrons to the QD phosphor particles 130, and thereby causes the QD phosphor particles 130 to emit light. QD phosphor particles 130 have high luminous efficiency (energy conversion efficiency), and are therefore suitable for improving the luminous efficiency of the light-emitting element 1.

The QD phosphor particles 130 are preferably particles with low scattering of visible light. The material of the QD phosphor particles 130 is preferably at least one type of semiconductor material selected from the group consisting of CdS, CdSe, CdTe, ZnS, ZnSe, ZnTe, InN, InP, InAs, InSb, AlP, AlS, AlAs, AlSb, GaN, GaP, GaAs, GaSb, PbS, PbSe, Si, Ge, MgS, MgSe, and MgTe and combinations thereof. More specifically, nano-sized crystals (semiconductor nanocrystals) of the above semiconductor material are used as the QD phosphor particles 130. Additionally, the QD phosphor particles 130 may be a two-component core type, a three-component core type, or a four-component core type.

Moreover, the QD phosphor particles 130 are preferably core-shell-type QD phosphor particles in which a core layer that forms a core of the QD phosphor particle is covered by a shell layer. The luminous efficiency of the QD phosphor particles 130 can thereby be increased. Furthermore, it is more preferable that the semiconductor material forming the shell layer has a larger band gap than that of the semiconductor material that forms the core layer. In this case, the luminous efficiency of the QD phosphor particles 130 can be further increased. The semiconductor material forming the shell layer is not particularly limited, and may be, for example, ZnS.

The QD phosphor particles 130 may be core-multishell type QD phosphor particles having a plurality of shell layers. The QD phosphor particles 130 may be QD phosphor particles containing a dopant, or may be QD phosphor particles that are manufactured such that the dopant concentration changes (is inclined) from the center to the exterior.

Known QD phosphor particles can be used, as appropriate, as the QD phosphor particles 130.

In (b) of FIG. 1, spherical QD phosphor particles 130 are exemplified. However, the shape of the QD phosphor particles 130 is not limited to a spherical shape. For example, the shape of the QD phosphor particles 130 may be a rod shape or a wire shape. Any known shape may be adopted as the shape of the QD phosphor particles 130.

(Method for Manufacturing Light-Emitting Element 1)

Figure 2:
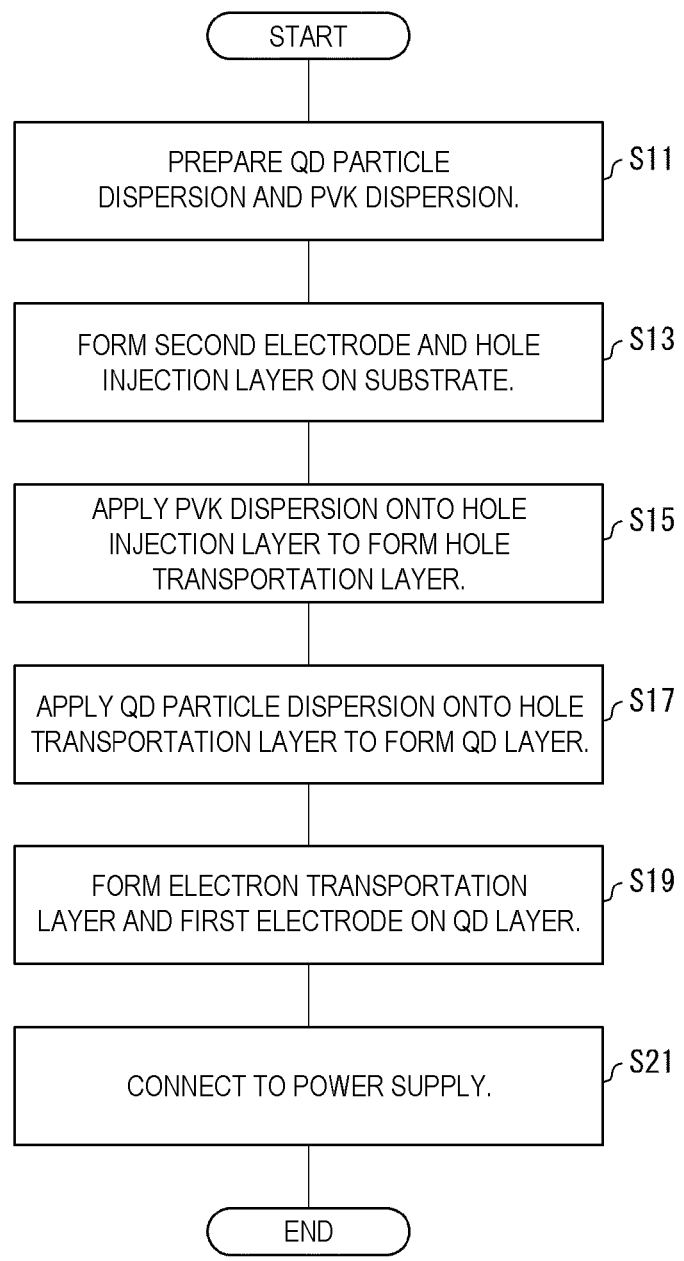
FIG. 2 is a flowchart of an exemplary method of manufacturing the light-emitting element of the first embodiment of the disclosure.

A method for manufacturing the light-emitting element 1 of the present embodiment will be described below with reference to FIG. 2. FIG. 2 is a flowchart of an exemplary method of manufacturing the light-emitting element 1 of the present embodiment. Here, a case in which the material constituting the hole transportation layer 14 in the light-emitting element 1 is PVK will be described. Note that a case in which the hole transportation layer 14 is formed of another material or a case in which the QD layer 13 is formed on the electron transportation layer 12 can also be understood with reference to the following description. As the hole transportation layer 14, poly[(9,9-dioctylfluorenyl-2,7-diyl)-co-(4,4'-(N-(p-butylphenyl)) diphenylamine)] (TFB) may be used, for example.

As illustrated in FIG. 2 (also see (a) of FIG. 1 below as appropriate), in the method of manufacturing the light-emitting element 1 of the present embodiment, first, a QD particle dispersion in which QD phosphor particles 130 are dispersed, and a PVK dispersion in which PVK is dispersed are prepared (step 11; abbreviated as S11 below) (liquid preparation step). This liquid preparation step will be described in detail below.

In the present manufacturing method, a second electrode 16 and a hole injection layer 15 are then formed on a substrate 17 (S13). Next, the PVK dispersion (first liquid composition) prepared in S11 is applied to the hole injection layer (first layer) 15 to form a hole transportation layer (second layer) 14 (S15; first layer forming step).

Next, the QD particle dispersion (second liquid composition) prepared in S11 is applied to the hole transportation layer 14 to form a QD layer (third layer) 13 (S17; second layer forming step). In addition, an electron transportation layer 12 and a first electrode 11 are formed on the QD layer 13 (S19). Next, the second electrode 16 and the first electrode 11 are connected to a power supply 18, and the light-emitting element 1 is thereby manufactured.

In the present specification, the steps S15 and S17 described above may be collectively referred to as an element forming step of forming the hole transportation layer 14 and the QD layer 13.

Note that in the present manufacturing method, S11 described above may be performed in parallel with S13, or S11 may be omitted and a pre-prepared QD particle dispersion and a pre-prepared PVK dispersion may be used in S15 and S17.

(Liquid Preparation Step)

Figure 3:
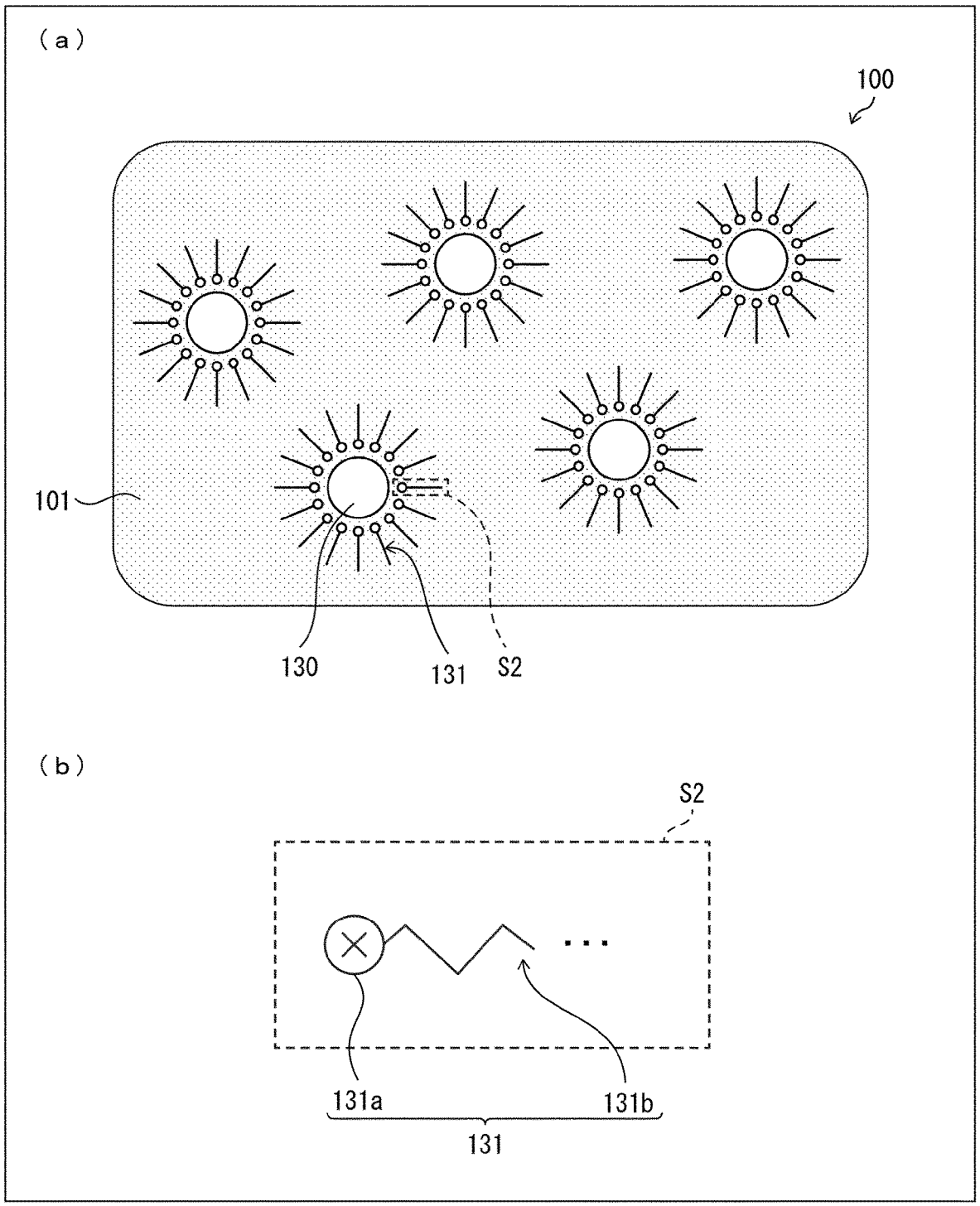
FIG. 3(a) is a schematic view illustrating a schematic configuration of a QD particle dispersion of the first embodiment of the disclosure.
FIG. 3(b) is a diagram illustrating a surface modification compound included in the QD particle dispersion.

The liquid preparation step in the method of manufacturing the light-emitting element 1 according to the present embodiment will be described below. In the description, the QD particle dispersion (second liquid composition) 100 of the present embodiment will be described using FIG. 3. The surface modification compound 131 of the QD phosphor particles 130 used when forming the QD layer 13 will be described in greater detail (a) of FIG. 3 is a schematic view illustrating a schematic configuration of a QD particle dispersion 100 of the present embodiment. (b) of FIG. 3 is a diagram illustrating the surface modification compound 131 by enlarging a portion (S2) of the QD phosphor particles 130 included in the QD particle dispersion 100.

(QD Particle Dispersion)

As illustrated in (a) and (b) FIG. 3, the QD particle dispersion 100 includes a solvent (second solvent) 101, QD phosphor particles 130 dispersed in the solvent 101, and the surface modification compound 131 that protects the surface of the QD phosphor particles 130.

The solvent 101 is not particularly limited as long as it can disperse the QD phosphor particles 130, and is, for example, a non-polar solvent. Furthermore, the solvent 101 may be an organic solvent such as methanol, ethanol, propanol, butanol, pentane, hexane, octane, acetone, toluene, xylene, benzene, chloroform, dichloromethane, and chlorobenzene. The solvent 101 may be one or a plurality of liquids selected from the group consisting of water, the above-mentioned organic solvents, and a combination of the above-mentioned organic solvents.

The surface modification compound 131 includes a functional group 131a having a heteroatom, and a chain-type saturated hydrocarbon group 131b. The surface modification compound 131 is a surfactant-based organic compound, and is a ligand that uses the QD phosphor particles 130 as receptors. The functional group 131a having a heteroatom of the surface modification compound 131 forms a coordinate bond with the QD phosphor particle 130. Through this, the QD phosphor particles 130 are stabilized (more specifically, are chemically stabilized) in the QD particle dispersion 100.

The functional group 131a having a heteroatom is a nitrogen-containing functional group, a sulfur-containing functional group, an acidic group, an amide group, a phosphine group, a phosphine oxide group, a hydroxyl group, or the like. The chain-type saturated hydrocarbon group 131b is represented by the molecular formula $C_nH_{2n+1}$ (n is a natural number).

Here, the surface free energy of the QD layer 13 formed using the QD particle dispersion 100 in S17 described above is referred to as a first surface free energy. In addition, the surface free energy of the underlayer formed in the S15 described above is referred to as a second surface free energy. In the present embodiment, the underlayer is the hole transportation layer 14, and specifically, is a layer formed from PVK.

Note that the underlayer may be either the hole transportation layer 14 or the electron transportation layer 12, and may be a layer that serves as a underlayer on which the QD layer 13 is formed.

In the QD particle dispersion 100, the surface modification compound 131 is selected such that the absolute value of the difference between the first surface free energy and the second surface free energy is 5 mN/m or less. Such surface modification compound 131 protects the surface of the QD phosphor particles 130, and can thereby increase both the dispersibility of the QD phosphor particles 130 in the solvent 101 and the wettability of the QD particle dispersion 100 to the underlayer. Note that the surface free energy can also be expressed in $J/m^2$.

That is, depending on the surface free energy of the underlayer, the surface modification compound 131 is selected such that the QD particle dispersion 100 has the desired surface free energy. In the above liquid preparation step, QD phosphor particles 130, which are surface-protected by the selected surface modification compound 131, are dispersed in the solvent 101 to prepare a QD particle dispersion 100.

Additionally, in the liquid preparation step described above, the QD particle dispersion 100 may be prepared by replacing a surface modification material of the surface of the QD phosphor particles 130. Specifically, for example, QD phosphor particles 130 for which the surface is protected by a certain surface modification compound are prepared. Furthermore, two different types of solvents that are not miscible are prepared. The QD phosphor particles 130 are then dispersed in one of the solvents (first solvent). The other solvent (second solvent) is configured to include the surface modification compound 131. Movement of the QD phosphor particles 130 from the first solvent to the second solvent causes the surface modification compound coordinated to the surface of the QD phosphor particles 130 to be exchanged. Through this, QD phosphor particles 130 that are surface-protected by the surface modification compound 131 are prepared. The QD particle dispersion 100 may be prepared using QD phosphor particles 130 that have been prepared in this manner.

The QD layer 13 can be easily and uniformly formed through a coating process such as spin coating in S17 (see FIG. 2) using the QD particle dispersion 100 described above. Through this, film formation defects such as the formation of pinholes in the QD layer 13 and aggregation of the QD phosphor particles 130 can be prevented. As a result, a decrease of the luminous efficiency of the QD layer 13 can be prevented.

The dispersibility of the QD phosphor particles 130 in the solvent 101 and the wettability of the QD particle dispersion 100 to the underlayer can be adjusted by changing the length (number of carbons) of the chain-type saturated hydrocarbon groups 131b in the surface modification compound 131.

Specific examples of the surface modification compound 131 include hexadecylamine, octylamine, hexadecanethiol, dodecanethiol, myristic acid, and palmitic acid.

Note that the QD particle dispersion 100 may include, in addition to the surface modification compound 131, a surface protection material that protects the surface of the QD phosphor particles 130. That is, the QD particle dispersion 100 may include a plurality of types of surface modification compounds as surface protection materials. In this case, the surface protection material may include the surface modification compound 131 as a main component.

"As a main component" means that when the surface protection material includes a plurality of types of surface modification compounds, the proportion of the surface modification compounds 131 is at least half (50% or greater). This is because in the case where the QD particle dispersion 100 includes a plurality of types of surface modification compounds, the surface modification compounds as the main component that account for half or more determines the properties of the QD particle dispersion 100.

In the surface modification compound 131, n in the molecular formula $C_nH_{2n+1}$ of the chain-type saturated hydrocarbon group 131b is preferably from 8 to 20. If n is less than 8, the dispersibility of the QD phosphor particles 130 in the solvent 101 may worsen. Also, if n is greater than 20, the injection efficiency of electrons or positive holes into the QD phosphor particles 130 may worsen.

Additionally, the QD particle dispersion 100 of the present embodiment does not include a binder. A binder is often commonly used because it serves as a substrate that supports the QD phosphor particles 130 in the QD layer 13 and improves the adhesion stability between the underlayer and the QD layer 13. However, the QD particle dispersion 100 of the present embodiment can uniformly form the QD layer 13 without using such binder.

The surface modification compound 131 is preferably an amine or a thiol. The bonding of amines and thiols to the surface of the QD phosphor particles 130 is relatively strong. Therefore, the luminous efficiency of the QD phosphor particles 130 can be increased by protecting the surface of the QD phosphor particles 130 with an amine or thiol.

However, if the amount of the surface modification compound 131 is too small relative to the QD phosphor particles 130, the surface of the QD phosphor particles 130 cannot be sufficiently modified by the surface modification compound 131 in the QD particle dispersion 100. Specifically, if the amount of the surface modification compound 131 is less than 0.1 parts by weight relative to 100 parts by weight of the QD phosphor particles 130, the surface of the QD phosphor particles 130 cannot be sufficiently modified by the surface modification compound 131 in the QD particle dispersion 100.

On the other hand, if the amount of the surface modification compound 131 is too large relative to the QD phosphor particles 130, the surface of the QD phosphor particles 130 is excessively modified by the surface modification compound 131. Specifically, in such a case, the amount of the surface modification compound 131 exceeds 100 parts by weight relative to 100 parts by weight of the QD phosphor particles 130. In this case, the QD phosphor particles 130 tend to easily aggregate in the QD particle dispersion 100.

In S17 in the above element forming step, the QD particle dispersion 100 is applied to the upper face of the hole transportation layer 14 to form a coating film of the QD particle dispersion 100. Then, as the solvent of the QD particle dispersion 100 volatilizes (e.g., as the coating film dries naturally), the coating film is solidified (cured). As a result, the QD layer 13 that includes the QD phosphor particles 130 and the surface modification compound 131 can be formed.

A known coating method (for example, an inkjet method or a spin coating method) may be used to apply the QD particle dispersion 100. That is, the method of manufacturing the light-emitting element 1 may include a coating step in which the QD particle dispersion 100 is applied. Further, the method of manufacturing the light-emitting element 1 may include a film formation step in which the QD layer 13 is formed using the QD particle dispersion 100 applied in the coating step.

For example, if a spin coating method is used, in the QD particle dispersion 100, the QD phosphor particles 130 are covered by the surface modification compound 131. Therefore, in the QD particle dispersion 100, the QD phosphor particles 130 are highly dispersible in the solvent 101, and wettability of the QD particle dispersion 100 to the hole transportation layer 14 is increased. Therefore, the QD layer 13 can be formed uniformly.

Generally, when a certain solution is applied to the underlayer using a spin coating method, if the viscosity of the solution is high, coating unevenness occurs, and a uniform film cannot be manufactured in some cases. In this case, various conditions such as the rotational speed and rotation time of the spin coater must be reviewed. On the other hand, since the QD particle dispersion 100 does not contain a binder, a relatively low viscosity can be achieved, and a uniform film without coating unevenness can be easily manufactured.

Furthermore, when an inkjet method is used, the following is true. Since the QD particle dispersion 100 does not contain a binder, a relatively low viscosity can be achieved. As a result, the likelihood of clogging occurring in the nozzles that discharge the QD particle dispersion 100 can be reduced.

With both the spin coating and inkjet methods, the QD layer 13 can be easily formed by not including a binder in the QD particle dispersion 100.

(PVK Dispersion)

Furthermore, in the liquid preparation step of the present embodiment, a PVK dispersion (first liquid composition) in which PVK is dispersed is prepared as a solution that is used to form the hole transportation layer 14. This PVK dispersion will be described with reference to FIG. 4. FIG. 4 is a schematic view illustrating a schematic configuration of a PVK dispersion 200 in the present embodiment.

As illustrated in FIG. 4, the PVK dispersion 200 contains a solvent (first solvent) 201 and PVK 210 dispersed in the solvent 201. The concentration of the PVK 210 in the PVK dispersion 200 is, for example, 5 mg/ml.

The solvent 201 is, for example, toluene. The solvent 201 is not limited thereto, and may be an organic solvent such as methanol, ethanol, propanol, butanol, pentane, hexane, octane, acetone, xylene, benzene, chloroform, dichloromethane, and chlorobenzene. The solvent 201 may be one or a plurality of liquids selected from the group consisting of water, the above-mentioned organic solvents, and a combination of the above-mentioned organic solvents.

In the liquid preparation step of one aspect of the disclosure, the solute of the first liquid composition may be selected according to the material constituting the hole transportation layer 14 or the electron transportation layer 12. That is, in another aspect of the disclosure, the first liquid composition may include, as a solute, a hole transport material such as PVK, or an electron transport material. In addition, the type of solvent 201 may be selected according to the solute.

(Measurement Method of Surface Free Energy)

A known method can be adopted as the measurement method of the surface free energy of the QD layer 13 and the hole transportation layer 14 (underlayer). For example, two liquids (for example, water and methylene iodide) having known surface free energies are placed on the surface of the QD layer 13 or the hole transportation layer 14, respectively. The surface free energy can be calculated by measuring the contact angle of each droplet and using the Owens-Wendt method.

(Advantageous Effects)

Since the QD phosphor exhibits a high level of brightness and light emission characteristics of a narrow light emission spectrum, the QD phosphor excels in color reproducibility and is attracting attention as a next-generation light-emitting device material. However, QD phosphor particles are generally inorganic structures, and therefore may become aggregated when mixed with a solvent containing an organic binder and formed into a solution state. In this case, the aggregation results in problems including a reduction in the quantum yield, and brightness unevenness of the QD layer or the formation of pinholes.

The QD particle dispersion 100 of the present embodiment includes a solvent 101, QD phosphor particles 130, and a surface protection material that protects the surface of the QD phosphor particles 130. The surface protection material includes, as a main component, a surface modification compound 131 formed from a functional group 131a having a heteroatom, and a chain-type saturated hydrocarbon group 131b represented by the molecular formula $C_nH_{2n+1}$ (n is a natural number).

In the QD particle dispersion 100, the surface modification compound 131 is selected such that the absolute value of the difference between the surface free energy of the QD layer 13 formed using the QD particle dispersion 100 and the surface free energy of the underlayer, for example, the hole transportation layer 14, is 5 mN/m or less.

The surface modification compound 131 can be arranged with high density on the surface of the QD phosphor particles 130. This is because, for example, the surface modification compound 131 does not have a branched structure like that of trioctylphosphine oxide (TOPO) or the like, and steric hindrance is low. Additionally, since the crystal size of the QD phosphor particles 130 is small, the value of the ratio (specific surface area) of the surface area divided by the volume is large. Thus, it is believed that a phenomenon occurs in which the surface free energy of the QD particle dispersion 100 changes according to the length of the alkyl chain of the surface modification compound 131 arranged on the surface of the QD phosphor particles 130.

The QD particle dispersion 100 exhibits high dispersibility of the QD phosphor particles 130 in the solvent 101, and can uniformly form the QD layer 13 on the underlayer. The QD particle dispersion 100 does not contain a binder. Thus, the QD particle dispersion 100 can be used to easily form the QD layer 13.

[Verification Experiment Results]

Verified experiment results regarding liquid compositions of the disclosure will be described.

EXPERIMENTAL EXAMPLES

Octylamine, hexadecylamine, octadecylamine, and oleylamine were used as the surface modification compound 131. Oleylamine has a double bond in a hydrocarbon group and therefore does not have a chain-type saturated hydrocarbon group 131b. Furthermore, a layer formed from PVK was used as the underlayer.

Core-shell quantum dots in which the shell layer was formed from ZnS were used as the QD phosphor particles 130. QD phosphor particles for which the surface was protected by a certain surface modifier were prepared, and the surface modifier on the surface thereof was exchanged with various amines to thereby prepare QD phosphor particles for which the surface was protected by each amine.

For each type of amine, a QD particle dispersion 100 was prepared such that the concentration of QD phosphor particles 130 was 12 mg/ml. A PVK dispersion 200 was prepared using toluene as the solvent such that the concentration of the PVK 210 was 5 mg/ml.

The surface free energy was determined for both the QD layer 13 and the underlayer (PVK), respectively, with the QD layer containing these amines and the QD phosphor particles 130.

Specifically, the QD particle dispersion 100 or the PVK dispersion 200 was applied onto glass by spin coating, and a QD film and a PVK film were prepared, respectively. Two types of liquids, namely water and methylene iodide, for which the surface free energy values are known were respectively dripped onto the films prepared by the method described above. The contact angles of the water and methylene iodide with respect to the QD film and the PVK film were measured, and the surface free energy values of the QD film (QD layer) and the PVK film (underlayer) were calculated using the Owens-Wendt method.

FIG. 5 is a table showing the surface free energy values of QD films containing the QD phosphor particles that were surface-protected by the various amines described above. The table of FIG. 5 also shows the difference between the surface free energy of these QD films and the surface free energy of the PVK film. As shown in FIG. 5, the difference between the surface free energy of the QD film when octylamine or hexadecylamine was used for the surface protection material and the surface free energy of the PVK film was approximately 2 mN/m. In contrast, the difference between the surface free energy of the QD film when octadecylamine or oleylamine was used for the surface protection material and the surface free energy of the PVK film exceeded 5 mN/m.

Regarding several amines with different numbers of carbons in the hydrocarbon chain (hydrocarbon chain length), the relationship between the hydrocarbon chain length and dispersibility, in a solvent, of QD phosphor particles for which the surface was protected by these amines was examined. The results are presented below. Specifically, amines for which n=4, 8, 12, 16 and 18 in the molecular formula $C_nH_{2n+1}$, including the amines described above in FIG. 5, were used. The QD phosphor particles 130 with these amines coordinated on the surface were dispersed in hexane as a solvent, and the solution was observed to determine whether turbidity occurred in the solution. The occurrence of turbidity in the solution means that the QD phosphor particles 130 agglomerated, or in other words, that dispersibility is poor. Thiols were similarly examined.

FIG. 6 is a table showing the dispersibility in solvents when various amines and thiols were used as surface modifiers, respectively. As shown in FIG. 6, turbidity did not occur in the solution in any of the cases when octylamine, hexadecylamine, octadecylamine, and oleylamine were used as surface modifiers. From this, it was confirmed that the dispersibility is good.

In contrast, when butylamine (n=4) was used as the surface modifier, turbidity occurred in the solution. Therefore, it was confirmed that dispersibility in the solvent was poor when the hydrocarbon chain length was short.

Similarly, with regard to the thiols as well, octanethiol, dodecanethiol, and hexadecanethiol exhibited good dispersibility, whereas butanethiol (n=4) exhibited inferior dispersibility.

Therefore, it is understood that the surface modification compound 131 is preferably such that n of the chain-type saturated hydrocarbon group 131b is 8 or greater.

Figure 7:
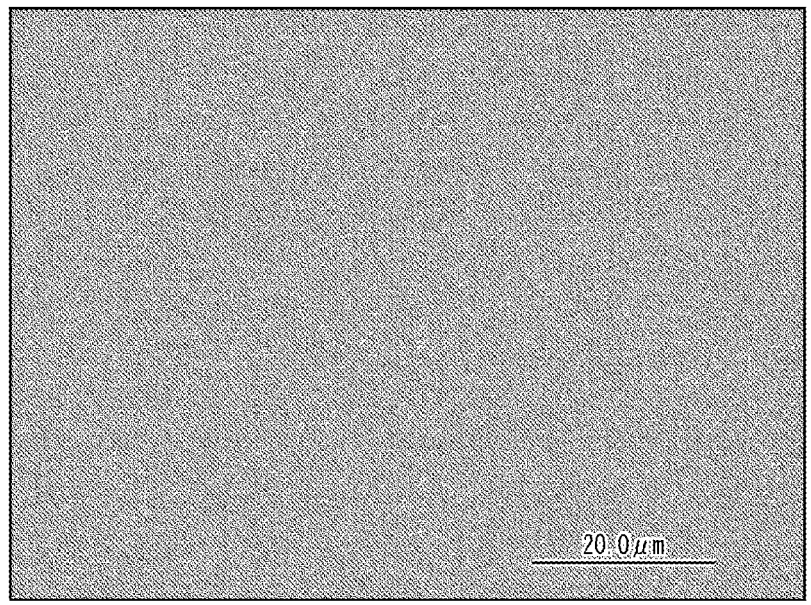
FIG. 7 is a plan view schematically illustrating a state of a QD layer formed uniformly by using octylamine as a surface modifier in an experimental example.
Figure 8:
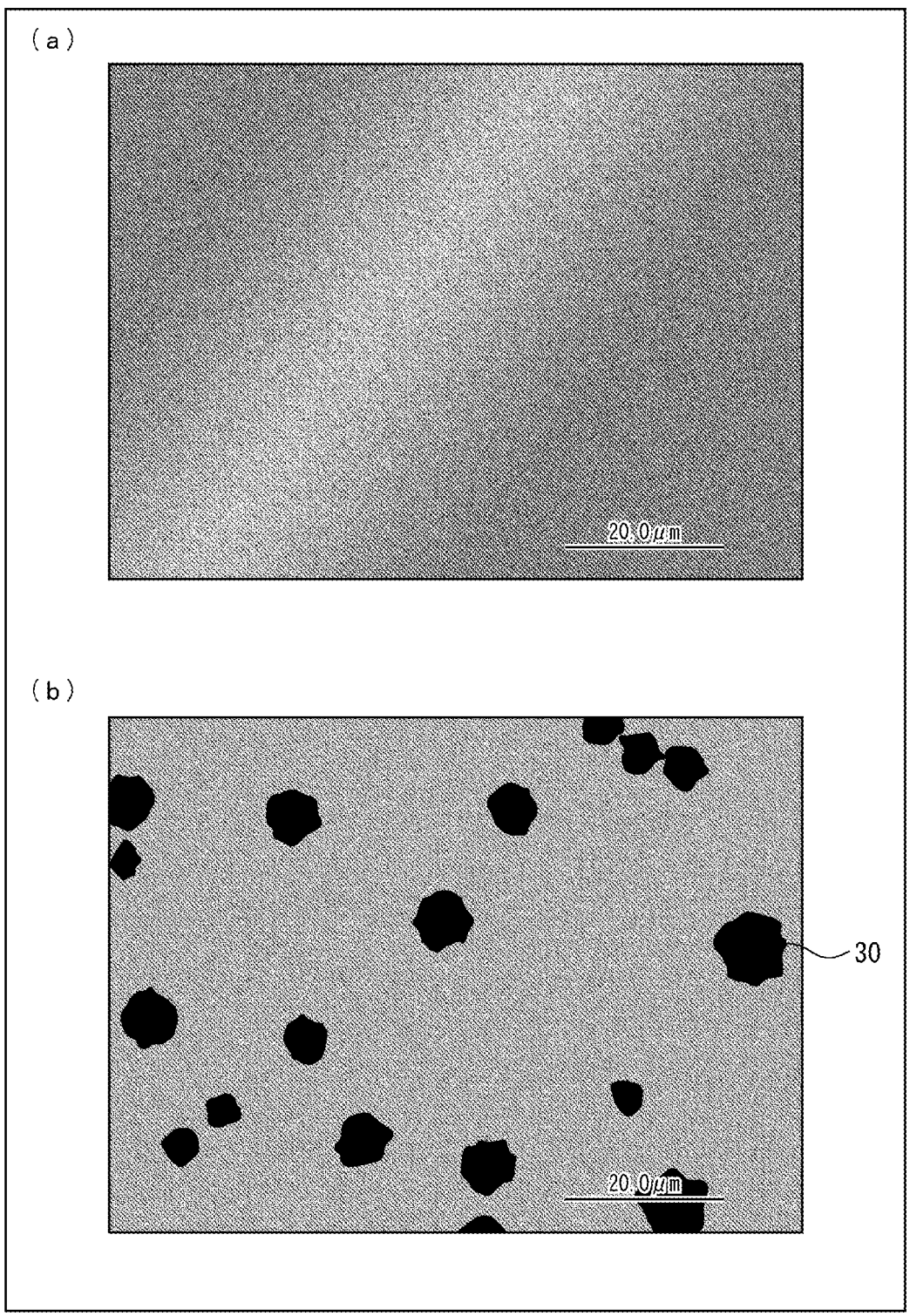
FIG. 8(a) is a plan view schematically illustrating, as a comparative example, a state of a QD layer in which coating unevenness has been generated.
FIG. 8(b) is a plan view schematically illustrating, as a comparative example, a state of a QD layer in which pinholes have been generated.

Next, a QD particle dispersion 100 prepared using octylamine, hexadecylamine, octadecylamine, or oleylamine as the surface modification compound 131 was used to form a QD layer 13 on a hole transportation layer 14 formed from PVK. The results are shown in FIG. 7 and FIG. 8. FIG. 7 is a plan view schematically illustrating the state of the QD layer uniformly formed using octylamine as the surface modification compound 131. (a) of FIG. 8 is a plan view schematically illustrating a state of a QD layer in which coating unevenness occurred using, as a comparative example, octadecylamine as the surface modification compound. (b) of FIG. 8 is a plan view schematically illustrating a state of a QD layer in which pinholes 30 were generated when oleylamine was used as the surface modification compound as a comparative example.

As illustrated in FIG. 7, when a QD particle dispersion 100 prepared by selecting octylamine as a surface modification compound 131 that satisfies the conditions stipulated by the disclosure, it was confirmed that the QD layer 13 can be formed uniformly.

On the other hand, as illustrated in FIG. 8, when octadecylamine and oleylamine were used as surface modification compounds in comparative examples, the difference between the surface free energy value of the surface modification compound and the surface free energy of the PVK was greater than 5 mN/m, and neither of the QD layers 13 could be uniformly formed.

From the above, it was shown that when a hole transportation layer 14 containing PVK is used as the underlayer, the QD layer 13 can be formed uniformly by using, as the surface modification compound 131, an amine for which n of the chain-type saturated hydrocarbon group 131b is from 8 to 16. Furthermore, dispersibility in the solvent can be improved by using these amines as the surface modification compound 131. Thus, the occurrence of defects such as aggregation, coating unevenness, and pinholes can be suppressed, and the QD layer 13 can be formed. As a result, the luminous efficiency of the QD layer 13 can be increased, and performance can be improved.

Furthermore, the following can be said from the above experimental examples. That is, in the above experimental examples, the surface free energy of the QD particle dispersion 100 is not directly evaluated for reasons like those described above. However, in cases in which the QD layer 13 could be uniformly formed using the QD particle dispersion 100, the difference between the surface free energy value of the QD layer 13 formed using the QD particle dispersion 100 and the surface free energy value of the underlayer (here, the hole transportation layer 14) was 5 mN/m or less. From this, it can be said that the QD layer can be uniformly formed on the underlayer by using a QD particle dispersion 100 that satisfies the conditions of the disclosure.

Second Embodiment

Another embodiment of the disclosure will be described below. Note that, for the convenience of description, members having the same functions as the members described in the foregoing embodiment will be given the same reference signs, and descriptions thereof will not be reiterated.

Unlike the first embodiment, the QD layer 13 may be configured as a light absorption layer that absorbs light of a predetermined wavelength band and generates an electrical signal (e.g., voltage or current). Through the same method as that of the first embodiment, the light absorption layer (QD layer 13) can be formed using the QD particle dispersion 100, and thereby a light absorption layer excelling in energy conversion efficiency (power generation efficiency) can be obtained.

In this manner, an element (photoelectric conversion element) according to one aspect of the disclosure may be configured as a light receiving element. The light receiving element may be used, for example, in an electronic device such as an image sensor or a solar cell.

Third Embodiment

Another embodiment of the disclosure will be described below. Note that, for the convenience of description, members having the same functions as the members described in the foregoing embodiment will be given the same reference signs, and descriptions thereof will not be reiterated.

In the first embodiment, the QD particle dispersion 100 did not contain a binder. In contrast, a QD particle dispersion 300 of the present embodiment may contain a binder.

Figure 9:
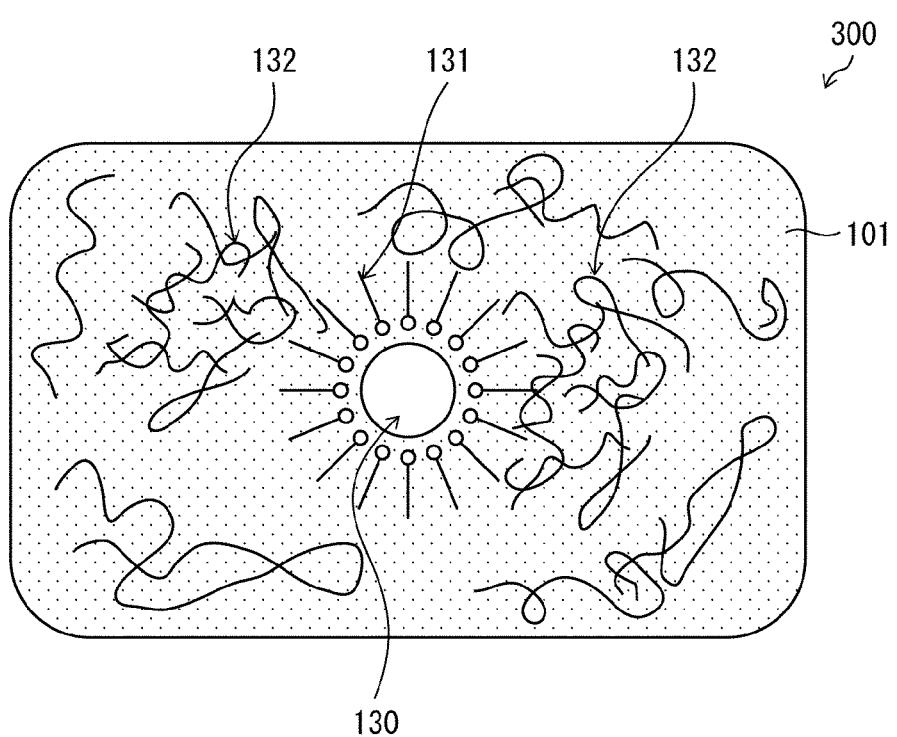
FIG. 9 is a diagram illustrating a schematic configuration of a QD particle dispersion according to a third embodiment.

FIG. 9 is a diagram illustrating a schematic configuration of a QD particle dispersion 300 of the present embodiment. As illustrated in FIG. 9, the QD particle dispersion 300 includes a solvent 101, QD phosphor particles 130 dispersed in the solvent 101, a surface modification compound 131 that protects the surface of the QD phosphor particles 130, and a binder 132.

A known binder may be used as the binder 132. The binder 132 may be, for example, a polymer-based surface modification compound including a chain-type polymer. Examples include polyvinyl pyrrolidone (PVP), polyethylene glycol (PEG), and polystyrene (PS).

Supplement

A liquid composition according to a first aspect of the disclosure is a liquid composition (QD particle dispersion 100) that is applied onto an underlayer (hole transportation layer 14, electron transportation layer 12) to thereby form a quantum dot layer (QD layer 13) containing quantum dot particles (QD phosphor particles 130), wherein the liquid composition includes: a solvent 101; quantum dot particles (QD phosphor particles 130) dispersed in the solvent; and a surface protection material protecting the surface of the quantum dot particles; the underlayer supplies electrons or positive holes to the quantum dot layer; the surface protection material contains, as a main component, a surface modification compound that includes: a functional group having a heteroatom, and a chain-type saturated hydrocarbon group represented by the molecular formula $C_nH_{2n+1}$ (n being a natural number); and an absolute value of a difference between the surface free energy of the quantum dot layer and the surface free energy of the underlayer is 5 mN/m or less.

According to the above-described configuration, the film formability of the quantum dot layer (QD layer) can be improved using the liquid composition. Therefore, the quantum dot layer can be uniformly formed, and the performance of the quantum dot layer can be improved.

A liquid composition according to a second aspect of the disclosure is such that in the first aspect, n in the surface modification compound is preferably from 8 to 20.

According to the above configuration, the dispersibility of the quantum dot particles in the liquid composition can be increased. In addition, in the quantum dot layer, the transport efficiency of the carrier can be increased, and the luminous efficiency can be improved.

A liquid composition according to a third aspect of the disclosure is such that in the first or second aspect, the surface modification compound is preferably an amine or a thiol.

According to the above configuration, the quantum dot phosphor particles can be further stabilized in the liquid composition.

A liquid composition according to a fourth aspect of the disclosure is such that in any of the first to third aspects above, in a case where the quantum dot layer is formed, the liquid composition preferably does not contain a binder serving as a base material that supports the quantum dot particles.

According to the above-described configuration, the quantum dot layer can be easily formed.

A method of manufacturing a photoelectric conversion element (light-emitting element 1) according to a fifth aspect of the disclosure is a method of manufacturing a photoelectric conversion element provided with the quantum dot layer (QD layer 13) between a first electrode 11 and a second electrode 16 disposed above the first electrode, the method including: a liquid preparation step of preparing a liquid composition described in any one of the first to fourth aspects; and a film formation step of forming the quantum dot layer on the underlayer using the liquid composition prepared in the liquid preparation step.

According to the above-described configuration, the quantum dot layer of the photoelectric conversion element can be formed uniformly using the liquid composition.

With a method of manufacturing a photoelectric conversion element according to a sixth aspect of the disclosure, in the fifth aspect, the underlayer is a hole transportation layer containing polyvinyl carbazole, and the first electrode and/or the second electrode may be a light-transmitting electrode.

A photoelectric conversion element (light-emitting element 1) according to a seventh aspect of the disclosure is provided with a quantum dot layer (QD layer 13) between a first electrode 11 and a second electrode 16 disposed above the first electrode, the photoelectric conversion element including: an underlayer (hole transportation layer 14, electron transportation layer 12) and the quantum dot layer formed on the underlayer, wherein the underlayer supplies electrons or positive holes to the quantum dot layer; the quantum dot layer includes quantum dot particles (QD phosphor particles 130) and a surface protection material protecting a surface of the quantum dot particles; the surface protection material contains, as a main component, a surface modification compound 131 including a functional group 131a having a heteroatom, and a chain-type saturated hydrocarbon group 131b represented by the molecular formula $C_nH_{2n+1}$ (n being a natural number); and an absolute value of a difference between the surface free energy of the quantum dot layer and the surface free energy of the underlayer is 5 mN/m or less.

According to the configuration described above, the film formability of the quantum dot layer can be improved when forming the quantum dot layer. Therefore, the quantum dot layer can be uniformly formed, and the performance of the quantum dot layer can be improved.

A photoelectric conversion element according to an eighth aspect of the disclosure is such that in the seventh aspect, n in the surface modification compound is preferably from 8 to 20.

According to the configuration described above, aggregation of the quantum dot particles in the quantum dot layer can be suppressed, the transport efficiency of the carrier can be increased, and the luminous efficiency can be improved.

A photoelectric conversion element according to a ninth aspect of the disclosure is such that in the seventh aspect, the underlayer is a hole transportation layer containing polyvinyl carbazole, and the surface modification compound may be an amine or thiol for which n is from 8 to 16.

A photoelectric conversion element according to a tenth aspect of the disclosure is such that in the seventh aspect, the underlayer is an electron transportation layer containing nanoparticles of ZnO, and the surface modification compound may be an amine or thiol for which n is from 8 to 16.

ADDITIONAL ITEMS

The disclosure is not limited to each of the embodiments described above, and various modifications may be made within the scope of the claims. Embodiments obtained by appropriately combining technical approaches disclosed in each of the different embodiments also fall within the technical scope of the disclosure. Moreover, novel technical features can be formed by combining the technical approaches disclosed in the embodiments.

The invention claimed is:

1. A liquid composition that is applied onto an underlayer to form a quantum dot layer comprising quantum dot particles, the liquid composition comprising:
 a solvent;
 quantum dot particles dispersed in the solvent; and
 a surface protection material protecting a surface of the quantum dot particles,
 wherein the underlayer supplies electrons or positive holes to the quantum dot layer;
 the surface protection material contains, as a main component, a surface modification compound comprising:
  a functional group having a heteroatom, and a chain-type saturated hydrocarbon group represented by the molecular formula $C_nH_{2n+1}$ (n being a natural number); and
 an absolute value of a difference between a surface free energy of the quantum dot layer and a surface free energy of the underlayer is 5 mN/m or less.

2. The liquid composition according to claim 1,
 wherein in the surface modification compound, n is from 8 to 20.

3. The liquid composition according to claim 1,
 wherein the surface modification compound is an amine or a thiol.

4. The liquid composition according to claim 1,
 wherein in a case where the quantum dot layer is formed, the liquid composition does not comprise a binder serving as a base material supporting the quantum dot particles.

5. A method of manufacturing a photoelectric conversion element provided with the quantum dot layer between a first electrode and a second electrode disposed above the first electrode, the method comprising:
 a liquid preparation step of preparing the liquid composition described in claim 1; and
 a film formation step of forming the quantum dot layer on the underlayer using the liquid composition prepared in the liquid preparation step.

6. The method of manufacturing a photoelectric conversion element according to claim 5,
 wherein the underlayer is a hole transportation layer containing polyvinyl carbazole; and
 at least one of the first electrode and the second electrode is a light-transmitting electrode.

7. The method of manufacturing a photoelectric conversion element according to claim 5,
 the surface free energy of the quantum dot layer is larger than the surface free energy of underlayer.

8. The liquid composition according to claim 1,
 wherein the surface modification compound is a thiol.

9. The liquid composition according to claim 1,
 the surface modification compound is selected at least one from a group consisting of hexadecanethiol, dodecanethiol, myristic acid, and palmitic acid.

10. The liquid composition according to claim 1,
 the surface free energy of the quantum dot layer is larger than the surface free energy of underlayer.

11. A photoelectric conversion element provided with a quantum dot layer between a first electrode and a second electrode disposed above the first electrode, the photoelectric conversion element comprising:
an underlayer; and
the quantum dot layer formed on the underlayer,
wherein the underlayer supplies electrons or positive holes to the quantum dot layer;
the quantum dot layer comprises quantum dot particles and a surface protection material protecting a surface of the quantum dot particles;
the surface protection material contains, as a main component, a surface modification compound comprising: a functional group having a heteroatom, and a chain-type saturated hydrocarbon group represented by the molecular formula $C_nH_{2n+1}$ (n being a natural number); and
an absolute value of a difference between a surface free energy of the quantum dot layer and a surface free energy of the underlayer is 5 mN/m or less.

12. The photoelectric conversion element according to claim 11,
wherein in the surface modification compound, n is from 8 to 20.

13. The photoelectric conversion element according to claim 11,
wherein the underlayer is a hole transportation layer containing polyvinyl carbazole; and
the surface modification compound is an amine or a thiol for which n is from 8 to 16.

14. The photoelectric conversion element according to claim 11,
wherein the underlayer is an electron transportation layer containing nanoparticles of ZnO; and
the surface modification compound is an amine or thiol for which n is from 8 to 16.

* * * * *